United States Patent
Sakurai et al.

[11] Patent Number: 6,013,415
[45] Date of Patent: Jan. 11, 2000

[54] RADIATION SENSITIVE COMPOSITION

[75] Inventors: Kouichi Sakurai; Takahiro Iijima, both of Yokkaichi; Yukiko Ito, Nagoya; Hiroaki Nemoto, Yokkaichi, all of Japan

[73] Assignee: JSR Corporation, Tokyo, Japan

[21] Appl. No.: 09/210,794

[22] Filed: Dec. 15, 1998

[30] Foreign Application Priority Data

Dec. 16, 1997 [JP] Japan .................................. 9-363243

[51] Int. Cl.$^7$ .................................................. G03C 1/725
[52] U.S. Cl. .......................... 430/281.1; 430/7; 430/910; 430/915; 430/916
[58] Field of Search ........................... 430/7, 281.1, 910, 430/915, 916

[56] References Cited

U.S. PATENT DOCUMENTS

| | | | |
|---|---|---|---|
| 4,683,190 | 7/1987 | Sondergeld et al. | 430/281 |
| 5,478,681 | 12/1995 | Yamasita et al. | 430/7 |
| 5,539,064 | 7/1996 | Hashimoto et al. | 525/529 |

FOREIGN PATENT DOCUMENTS 8-259876  10/1996  Japan .

OTHER PUBLICATIONS

Encyclopedia of Chemical Technology, Kroschwitz, J. ed., John Wiley & Sons, New York, 1996, vol. 19, pp. 41, 53–63.

*Primary Examiner*—Hoa Van Le
*Assistant Examiner*—Rosemary Ashton
*Attorney, Agent, or Firm*—Oblon, Spivak, McClelland, Maier & Neustadt, P.C.

[57] ABSTRACT

A radiation sensitive composition comprising (A) a colorant, (B) an alkali-soluble resin, (C) a polyfunctional monomer and (D) a photopolymerization initiator. The alkali-soluble resin (B) is a copolymer of (1) a monomer represented by the following formula (1):

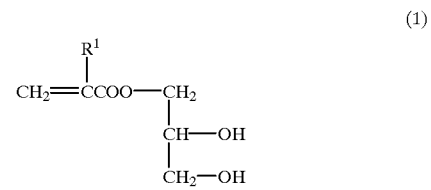

(1)

wherein $R^1$ is a hydrogen atom or a methyl group, and (2) an ethylenically unsaturated monomer having at least one carboxyl group in the molecule, and optionally (3) a copolymerizable ethylenically unsaturated monomer other than the above monomers (1) and (2). The radiation sensitive composition is useful for producing a color filter for transmission-type or reflection-type color liquid crystal display devices, etc.

13 Claims, No Drawings

RADIATION SENSITIVE COMPOSITION

DETAILED DESCRIPTION OF THE INVENTION

The present invention relates to a radiation sensitive composition. More specifically, it relates to a radiation sensitive composition which can be used for easily producing a color filter for use in transmission-type or reflection-type color liquid crystal display devices, color image pick-up elements and the like.

To produce a color filter using a radiation sensitive composition, the radiation sensitive composition is coated on a substrate or a substrate having a light screening layer of a desired pattern formed thereon and dried, and the dried coating film is exposed to radiation to a desired pattern (to be referred to as "exposure" hereinafter) and developed to obtain pixels of each color. The thus produced color filter has such a problem that scum or stains are easily produced on the substrate or the light screening layer of unexposed portions. This phenomenon tends to be more prominent as the concentration of a pigment contained in the radiation sensitive composition increases, thereby making it difficult to attain sufficient color strength.

It is therefore an object of the present invention to provide a radiation sensitive composition that shows excellent developability even when it contains a pigment in a high concentration.

It is another object of the present invention to provide a novel radiation sensitive composition that can provide pixels having excellent adhesion to a substrate and a light screening layer without producing scum or stains on the substrate and the light screening layer of unexposed portions at the time of development.

Other objects and advantages of the present invention will become apparent from the following description.

According to the present invention, firstly, the above objects and advantages of the present invention are attained by a radiation sensitive composition (may be referred to as "the first radiation sensitive composition of the present invention" hereinafter) comprising (A) a colorant, (B) an alkali-soluble resin, (C) a polyfunctional monomer and (D) a photopolymerization initiator.

According to the present invention, secondly, the above objects and advantages of the present invention are attained by a radiation sensitive composition (may be referred to as "the second radiation sensitive composition of the present invention" hereinafter) comprising (A) a colorant, (B) an alkali-soluble resin, (C) a polyfunctional monomer, (D) a photopolymerization initiator and (E) an organic amino compound having at least one amino group in the molecule and a molecular weight of 1,000 or less.

The term "radiation" as used in the present invention includes visible light, ultraviolet light, far ultraviolet light, electron beam, X-ray and the like.

Each component constituting the present invention will be described hereunder.

(A) colorant

The colorant in the present invention is not limited to a particular color and is suitably selected according to the application purpose of the obtained color filter. It may be either organic or inorganic.

Specific examples of the organic colorant include organic synthetic dyes, organic pigments, organic natural coloring matters and the like. Specific examples of the inorganic colorant include inorganic pigments, inorganic salts called "extender" and the like. Since highly accurate color development and heat resistance are required of color filters, the colorant used in the present invention preferably has high color developing properties and high heat resistance, particularly preferably high thermal decomposition resistance. An organic colorant is generally used, and an organic pigment is particularly preferred.

Illustrative examples of the organic pigment include compounds classified into the group of pigments according to color index (C.I.; issued by The Society of Dyers and Colourists Co.) and having the following color index numbers, such as C.I. Pigment Yellow 83, C.I. Pigment Yellow 110, C.I. Pigment Yellow 138, C.I. Pigment Yellow 139, C.I. Pigment Yellow 150 and C.I. Pigment Yellow 155; C.I. Pigment Orange 71; C.I. Pigment Violet 19 and C.I. Pigment Violet 23; C.I. Pigment Red 48:1, C.I. Pigment Red 48:2, C.I. Pigment Red 48:3, C.I. Pigment Red 48:4, C.I. Pigment Red 122, C.I. Pigment Red 177, C.I. Pigment Red 202, C.I. Pigment Red 206, C.I. Pigment Red 207, C.I. Pigment Red 209, C.I. Pigment Red 224 and C.I. Pigment Red 254; C.I. Pigment Blue 15:3, C.I. Pigment Blue 15:4 and C.I. Pigment Blue 15:6; C.I. Pigment Green 7 and C.I. Pigment Green 36; C.I. Pigment Brown 23 and C.I. Pigment Brown 25; and C.I. Pigment Black 1 and C.I. Pigment Black 7.

Specific examples of the inorganic colorant include titanium oxide, barium sulfate, calcium carbonate, zinc oxide, lead sulfate, yellow lead, zinc yellow, red iron oxide (III), cadmium red, ultramarine blue, Prussian blue, chromium oxide green, cobalt green, amber, titanium black, synthetic iron black, carbon black and the like.

The above colorants may be used alone or in admixture of two or more.

In the present invention, the surface of each of these colorants may be modified with a polymer before use. The polymer for modifying the surface of a colorant is a polymer disclosed by JP-A 8-259876 (the term "JP-A" as used herein means an "unexamined published Japanese patent application"), a variety of commercially available polymers or oligomers for dispersing a pigment, or the like.

The colorant in the present invention may be used in combination with a dispersant as required.

The dispersant is, for example, a cationic, anionic, non-ionic or amphoteric surfactant, or a silicone or fluorine surfactant.

Specific examples of the surfactant include polyoxyethylene alkyl ethers such as polyoxyethylene lauryl ether, polyoxyethylene stearyl ether and polyoxyethylene oleyl ether; polyoxyethylene alkylphenyl ethers such as polyoxyethylene octylphenyl ether and polyoxyethylene nonylphenyl ether; polyethylene glycol diesters such as polyethylene glycol dilaurate and polyethylene glycol distearate; sorbitan fatty acid esters; fatty acid modified polyesters; tertiary amine modified polyurethanes; polyethyleneimines; others available under the trade name of KP (Shin-Etsu Chemical Co.), Polyflow (Kyoeisha Yushi Kagaku Kogyo Co., Ltd.), F-Top (Tokem Products Co.), MEGAFAC (Dainippon Ink & Chemicals Co.), Fluorad (Sumitomo 3M Co.), Asahi Guard and Surflon (Asaki Glass Co.), and the like.

These surfactants may be used alone or in admixture of two or more.

The surfactant is preferably used in an amount of 50 parts or less by weight, more preferably 0 to 30 parts by weight, based on 100 parts by weight of all the pigments.

(B) alkali-soluble resin

The alkali-soluble resin in the present invention includes a copolymer (to be referred to as "copolymer (1)"

hereinafter) of a monomer represented by the above formula (1) (to be referred to as "monomer (1)" hereinafter) and other copolymerizable monomer. The monomer of the formula (1) in which $R^1$ is a methyl group is called "glycerol monomethacrylate" in the following description.

The above other copolymerizable monomer is preferably an ethylenically unsaturated monomer (to be simply referred to as "carboxyl group-containing unsaturated monomer" hereinafter), which is copolymerizable with the monomer (1), can produce an alkali-soluble copolymer and has at least one carboxyl group in the molecule, and other copolymerizable ethylenically unsaturated monomer (to be simply referred to as "other unsaturated monomer" hereinafter) as required.

Illustrative examples of the above carboxyl group-containing ethylenically unsaturated monomer include unsaturated monocarboxylic acids such as acrylic acid, methacrylic acid, crotonic acid, α-chloroacrylic acid and cinammic acid; unsaturated dicarboxylic acids and anhydrides thereof, such as maleic acid, maleic anhydride, fumaric acid, itaconic acid, itaconic anhydride, citraconic acid, citraconic anhydride and mesaconic acid; unsaturated polycarboxylic acids having a valence of 3 or more and anhydrides thereof; mono[(meth)acryloyloxyalkyl]esters of polycarboxylic acids having a valence of 2 or more, such as mono(2-acryloyloxyethyl) succinate, mono(2-methacryloyloxyethyl) succinate, mono(2-acryloyloxyethyl) phthalate and mono(2-methacryloyloxyethyl) phthalate; mono(meth)acrylates of both-terminal carboxy polymers such as ω-carboxy-polycaprolactone monoacrylate and ω-carboxy-polycaprolactone monomethacrylate; and the like.

These carboxyl group-containing unsaturated monomers may be used alone or in admixture of two or more.

Illustrative examples of the other copolymerizable unsaturated monomer include aromatic vinyl compounds such as styrene, α-methylstyrene, o-vinyltoluene, m-vinyltoluene, p-vinyltoluene, p-chlorostyrene, o-methoxystyrene, m-methoxystyrene, p-methoxystyrene, indene, o-vinylbenzyl methyl ether, m-vinylbenzyl methyl ether, p-vinylbenzyl methyl ether, o-vinylbenzyl glycidyl ether, m-vinylbenzyl glycidyl ether and p-vinylbenzyl glycidyl ether; unsaturated carboxylates such as methyl acrylate, methyl methacrylate, ethyl acrylate, ethyl methacrylate, n-propyl acrylate, n-propyl methacrylate, i-propyl acrylate, i-propyl methacrylate, n-butyl acrylate, n-butyl methacrylate, i-butyl acrylate, i-butyl methacrylate, sec-butyl acrylate, sec-butyl methacrylate, t-butyl acrylate, t-butyl methacrylate, 2-hydroxyethyl acrylate, 2-hydroxyethyl methacrylate, 2-hydroxypropyl acrylate, 2-hydroxypropyl methacrylate, 3 -hydroxypropyl acrylate, 3-hydroxypropyl methacrylate, 2 -hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate, cyclohexyl acrylate, cyclohexyl methacrylate, phenyl acrylate, phenyl methacrylate, 2-methoxyethyl acrylate, 2-methoxyethyl methacrylate, 2-phenoxyethyl acrylate, 2-phenoxyethyl methacrylate, methoxydiethylene glycol acrylate, methoxydiethylene glycol methacrylate, methoxytriethylene glycol acrylate, methoxytriethylene glycol methacrylate, methoxypropylene glycol acrylate, methoxypropylene glycol methacrylate, methoxydipropylene glycol acrylate, methoxydipropylene glycol methacrylate, isobornyl acrylate, isobornyl methacrylate, dicyclopentadienyl acrylate, dicyclopentad.ienyl methacrylate, 2-hydroxy-3-phenoxypropyl ac:rylate and 2-hydroxy-3-phenoxypropyl methacrylate; unsaturated aminoalkyl carboxylates such as 2-aminoethyl acrylate, 2-aminoethyl methacrylate, 2-dimethylaminoethyl acrylate, 2-dimethylaminoethyl methacrylate, 2-aminopropyl acrylate, 2-aminopropyl methacrylate, 2-dimethylaminopropyl acrylate, 2-dimethylaminopropyl methacrylat:e, 3-aminopropyl acrylate, 3-aminopropyl methacrylate, 3-dimethylaminopropyl acrylate and 3-dimethylaminopropyl methacrylate; unsaturated glycidyl carboxylates such as glycidyl acrylate and glycidyl methacrylate; vinyl carboxylates such as vinyl acetate, vinyl propionate, vinyl butyrate and vinyl benzoate; unsaturated ethers such as vinyl methyl ether, vinyl ethyl ether, allyl glycidyl ether and methallyl glycidyl ether; vinyl cyanide compounds such as acrylonitrile, methacrylonitrile, α-chloroacrylonitrile and vinylidene cyanide; unsaturated amides such as acrylamide, methacrylamide, α-chloroacrylamide, N-2-hydroxyethyl acrylamide and N-2-hydroxyethyl methacrylamide; unsaturated imides such as maleimide, N-phenylmaleimide and N-cyclohexyl maleimide; aliphatic conjugated dienes such as 1,3-butadiene, isoprene and chloroprene; macromonomers having a monoacryloyl group or monomethacryloyl group at the terminal of a polymer molecular chain, such as polystyrene, polymethyl acrylate, polymethyl methacrylate, poly-n-butyl acrylate, poly-n-butyl methacrylate and polysiloxane; and the like.

These other unsaturated monomers may be used alone or in admixture of two or more.

The copolymer (1) is particularly preferably a copolymer (to be referred to as "alkali-soluble resin (I)" hereinafter) comprising the monomer (1), (a) a carboxyl group-containing unsaturated monomer comprising acrylic acid and/or methacrylic acid as an essential ingredient and mono (2-acryloyloxyethyl) succinate and/or mono(2-methacryloyloxyethyl) succinate as the case may be and (b) at least one member selected from the group consisting of styrene, 2-hydroxyethyl methacrylate, benzyl methacrylate and N-phenylmaleimide.

Specific examples of the alkali-soluble resin (I) include a copolymer of methacrylic acid/glycerol monomethacrylate/benzyl methacrylate, copolymer of methacrylic acid/glycerol monomethacrylate/styrene/N-phenylmaleimide, copolymer of methacrylic acid/glycerol monomethacrylate/2-hydroxyethyl methacrylate/benzyl methacrylate, copolymer of methacrylic acid/mono(2-acryloyloxyethyl) succinate/glycerol monomethacrylate/benzyl methacrylate, copolymer of methacrylic acid/glycerol monomethacrylate/styrene/benzyl methacrylate/N-phenylmaleimide, copolymer of methacrylic acid/mono(2-acryloyloxyethyl) succinate/glycerol monomethacrylate/styrene/N-phenylmaleimide, copolymer of methacrylic acid/mono(2-acryloyloxyethyl) succinate/glycerol monomethacrylate/2-hydroxyethyl methacrylate/benzyl methacrylate, and the like.

They may be used alone or in admixture of two or more.

The proportion of the monomer (1) in the copolymer (1) is preferably 5 to 35 wt %, more preferably 10 to 25 wt %. When the proportion of the monomer (1) is less than 5 wt %, scum or stains may be produced on the substrate or the light screening layer of unexposed portions. On the other hand, when the proportion is more than 35 wt %, the formed pixels are liable to fall off from the substrate at the time of development with an alkali developer.

When the copolymer (1) is a copolymer of the monomer (1), a carboxyl group-containing ethylenically unsaturated monomer and other unsaturated monomer, the proportion of the carboxyl group-containing ethylenically unsaturated monomer is preferably 5 to 50 wt %, more preferably 10 to 40 wt % and the proportion of the other unsaturated monomer is preferably 15 to 90 wt %, more preferably 35 to 80 wt %. When the proportion of the carboxyl group-containing ethylenically unsaturated monomer is less than 5 wt %, the solubility of the obtained radiation sensitive composition in an alkali developer is liable to lower. On the other hand, when the proportion is more than 50 wt %, the formed pixels are liable to fall off from the substrate or the surface of the pixel is apt to be roughened at the tine of development with an alkali developer. Particularly, the copolymer (1) containing the carboxyl group-containing ethylenically unsaturated monomer in the above specific proportion has excellent solubility in an alkali developer. In a radiation sensitive composition containing the copolymer as a binder, an undissolved product rarely remains after development with an alkali developer, scum or stains are hardly produced on the substrate or the light screening layer of unexposed portions, and pixels obtained from the composition are not dissolved excessively in the alkali developer, have excellent adhesion to the substrate and do not fall off from the substrate.

The above copolymers (1) may be used alone or in admixture of two or more.

In the present invention, the copolymer (1) may be used in combination with other alkali-soluble resin as the case may be.

The other alkali-soluble resin is a resin containing an acid functional group such as a carboxyl group or a phenolic hydroxyl group.

The other alkali-soluble resin is preferably a resin containing a carboxyl group, more preferably a copolymer of the carboxyl group-containing ethylenically unsaturated monomer and the other copolymerizable unsaturated monomer as named for the above copolymer (1). The other alkali-soluble resin is particularly preferably a copolymer (to be referred to as "alkali-soluble resin (II)" hereinafter) of (1) a carboxyl group-containing unsaturated monomer comprising acrylic acid and/or methacrylic acid as an essential ingredient and mono(2-acryloyloxyethyl)succinate and/or mono(2-methacryloyloxyethyl) succinate as the case may be and (2) at least one member selected from the group consisting of styrene, methyl acrylate, methyl methacrylate, 2-hydroxyethyl acrylate, 2-hydroxyethyl methacrylate, allyl acrylate, allyl methacrylate, benzyl acrylate, benzyl methacrylate, N-phenylmaleimide, polystyrene macromonomer and polymethyl methacrylate macromonomer.

Specific examples of the alkali-soluble resin (II) include a copolymer of (meth)acrylic acid/methyl (meth)acrylate, copolymer of (meth)acrylic acid/benzyl (meth)acrylate, copolymer of (meth)acrylic acid/methyl (meth)acrylate/ polystyrene macromonomer, copolymer of (meth)acrylic acid/methyl (meth)acrylate/polymethyl methacrylate macromonomer, copolymer of (meth)acrylic acid/benzyl (meth)acrylate/polystyrene macromonomer, copolymer of (meth)acrylic acid/benzyl (meth)acrylate/polymethyl methacrylate macromonomer, copolymer of (meth)acrylic acid/ 2-hydroxyethyl (meth)acrylate/benzyl (meth)acrylate, copolymer of (meth)acrylic acid/2-hydroxyethyl (meth) acrylate/benzyl (meth)acrylate/polystyrene macromonomer, copolymer of (meth)acrylic acid/2-hydroxyethyl (meth) acrylate/benzyl (meth)acrylate/polymethyl methacrylate macromonomer, copolymer of (meth)acrylic acid/styrene/ benzyl (meth)acrylate/N-phenylmaleimide, copolymer of (meth)acrylic acid/mono[2-(meth)acryloyloxyethyl] succinate/styrene/benzyl (meth)acrylate/N- phenylmaleimide, copolymer of (meth)acrylic acid/mono[2-(meth)acryloyloxyethyl] succinate/styrene/allyl (meth) acrylate/N-phenylmaleimide, and the like.

These alkali-soluble resins (II) may be used alone or in admixture of two or more.

When the other alkali-soluble resin is used, the amount of the resin used is preferably 50 wt % or less, more preferably 30 wt % or less, based on the total weight of all the alkali-soluble resins. When the amount of the other alkali-soluble resin is larger than 50 wt %, scum or stains are liable to be produced on the substrate or the light screening layer of unexposed portions.

The alkali-soluble resin in the present invention contains the copolymer (1) as an essential ingredient. Each component forming the alkali-soluble resin preferably has a weight average molecular weight in terms of polystyrene measured by gel permeation chromatography (GPC: tetrahydrofuran as a solvent) (to be simply referred to as "weight average molecular weight" hereinafter) of 3,000 to 300,000, particularly preferably 5,000 to 100,000. By using this alkali-soluble resin having a specific weight average molecular weight, a radiation sensitive composition having excellent developability can be obtained, whereby pixels having a sharp pattern edge can be formed and scum, stains, film residues or the like are hardly produced on the substrate or the light screening layer of unexposed portions at the time of development.

The number average molecular weight in terms of polystyrene of the alkali-soluble resin (B) is preferably 3,000 to 60,000, particularly preferably 5,000 to 25,000.

The amount of the alkali-soluble resin (B) used in the present invention is preferably 10 to 1,000 parts by weight, more preferably 20 to 500 parts by weight, based on 100 parts by weight of the colorant (A). When the amount of the alkali-soluble resin is smaller than 10 parts by weight, for example, alkali developability may deteriorate, or scum, stains or the like may be produced on the substrate or the light screening layer of unexposed portions. On the other hand, when the amount is larger than 1,000 parts by weight, it may be difficult for the resulting thin film to achieve target color strength due to a reduction in the concentration of the colorant.

(C) Polyfunctional Monomer

The polyfunctional monomer in the present invention is a monomer having at least two polymerizelble unsaturated bonds such as an acrylate group or methacrylate group.

Illustrative examples of the polyfunctional monomer include diacrylates and dimethacrylates of alkylene glycols such as ethylene glycol and propylene glycol; diacrylates and dimethacrylates of polyalkylene glycols such as polyethylene glycol and polypropylene glycol; polyacrylates and polymethacrylates of polyhydric alcohols having a valence of 3 or more such as glycerin, trimethylolpropane, pentaerythritol and dipentaerythritol and dicarboxylic acid-modified products thereof; oligoacrylates and oligomethacrylates of polyesters, epoxy resins, urethane resins, alkyd resins, silicone resins and spiran resins; diacrylates and (iimethacrylates of both terminal hydroxylated polymers such as both-terminal hydroxypoly-1,3-butadiene, both-terminal hydroxypolyisoprene and both-terminal hydroxypolycaprolactone; tris(2-acryloyloxyethyl) phosphate, tris(2-methacryloyloxyethyl)phosphate, and the like.

Of these polyfunctional monomers, preferred are polyacrylates and polymethacrylates of polyhydric alcohols having a valence of 3 or more and dicarboxylic acid-modified products thereof, such as trimethylolpropane triacrylate, trimethylolpropane trimethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, dipentaerythritol hexamethacrylate, and compounds represented by the following formula (2). Of these, more preferred are trimethylolpropane triacrylate, pentaerythritol triacrylate, pentaerythritol tetraacrylate, dipentaerythritol pentaacrylate and dipentaerythritol hexaacrylate, and particularly preferred are trimethylolpropane triacrylate, pentaerythritol triacrylate and dipentaerythritol hexaacrylate because they have high pixel strength, smooth pixel surface and hardly produce stains, film residues or the like on the substrate or the light screening layer of unexposed portions.

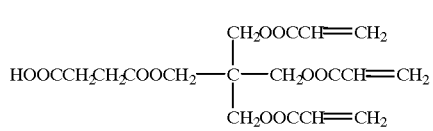

(2)

The above polyfunctional monomers may be used alone or in admixture of two or more.

The amount of the polyfunctional monomer used in the present invention is preferably 5 to 500 parts by weight, more preferably 20 to 300 parts by weight, based on 100 parts by weight of the alkali-soluble resin (B). When the amount of the polyfunctional monomer is smaller than 5 parts by weight, the strength and surface smoothness of the obtained pixel are liable to deteriorate. On the other hand, when the amount is larger than 500 parts by weight, for example, alkali developability is apt to degrade, or stains or film residues are liable to be produced in an area other than a portion where pixels are formed on the substrate.

In the present invention, a monofunctional monomer may be used in combination with the above polyfunctional monomer as required.

Specific examples of the monofunctional monomer include carboxyl group-containing ethylenically unsaturated monomers and copolymerizable unsaturated monomers as listed for the above carboxyl group-containing copolymer, a commercial product M-5300 (trade name, manufactured by Toagosei Chemical Industry Co., Ltd.) and the like.

These monofunctional monomers may be used alone or in admixture of two or more.

The proportion of the monofunctional monomer is preferably 90 wt % or less, more preferably 0 to 50 wt %, based on the total of the polyfunctional monomer and the monofunctional monomer. When the proportion is more than 90 wt %, the strength and surface smoothness of the obtained pixel may be insufficient.

(D) Photopolymerization Initiator

The term "photopolymerization initiator" as used in the present invention refers to a compound which causes decomposition or the cleavage of a bond and forms an active species capable of initiating the polymerization of the above polyfunctional monomer (C), such as a radical, cation or anion, when irradiated with radiation such as visible light, ultraviolet light, far ultraviolet light, electron beam or X-ray (to be referred to as "exposure" hereinafter).

Illustrative examples of the photopolymerization initiator include imidazole compounds having at least one main skeleton represented by the following formulas (3), (4) or (5), benzoin compounds, acetophenone compounds, benzophenone compounds, α-diketone compounds, polynuclear quinone compounds, xanthone compounds, diazo compounds, triazine compounds and the like.

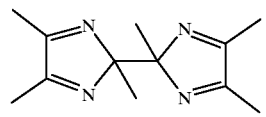

(3)

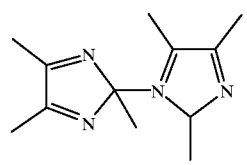

(4)

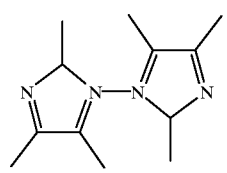

(5)

Specific examples of the imidazole compounds include 2,2'-bis(2-chlorophenyl)-4,4',5,5'-tetrakis(4-methoxycarbonylphenyl)-1,2'-biimidazole, 2,2'-bis(2-chlorophenyl)-4,4',5,5'-tetrakis(4-ethoxycarbonylphenyl)-1,2'-biimidazole, 2,2'-bis(2-chlorophenyl)-4,4',5,5'-tetrakis(4-phenoxycarbonylphenyl)-1,2'-biimaidazole, 2,2'-bis(2,4-dichlorophenyl)-4,4',5,5'-tetrakis(4-methoxycarbonylphenyl)-1,2'-biimidazole, 2,2'-bis(2,4-dichlorophenyl)-4,4',5,5'-tetrakis(4-ethoxycarbonylphenyl)-1,2'-biimidazole, 2,2'-bis(2,4-dichlorophenyl)-4,4',5,5'-tetrakis(4-phenoxycarbonylphenyl)-1,2'-biimidazole, 2,2'-bis(2,4,6-trichlorophenyl)-4,4',5,5'-tetrakis(4-methoxycarbonylphenyl)-1,2'-biimidazole, 2,2'-bis(2,4,6-trichlorophenyl)-4,4',5,5'-tetrakis(4-ethoxycarbonylphenyl)-1,2'-biimidazole, 2,2'-bis(2,4,6-trichlorophenyl)-4,4',5,5'-tetrakis(4-phenoxycarbonylphenyl)-1,2'-biimidazole, 2,2'-bis(2-bromophenyl)-4,4',5,5'-tetrakis(4-methoxycarbonylphenyl)-1,2'-biimidazole, 2,2'-bis(2-bromophenyl)-4,4',5,5'-tetrakis(4-ethoxycarbonylphenyl)-1,2'-biimidazole, 2,2'-bis(2-bromophenyl)-4,4',5,5'-tetrakis(4-phenoxycarbonylphenyl)-1,2'-biimidazole, 2,2'-bis(2,4-dibromophenyl)-4,4',5,5'-tetrakis(4-methoxycarbonylphenyl)-1,2'-biimidazole, 2,2'-bis(2,4-dibromophenyl)-4,4',5,5'-tetrakis(4-ethoxycarbonylphenyl)-1,2'-biimidazole, 2,2'-bis(2,4-dibromophenyl)-4,4',5,5'-tetrakis(4-phenoxycarbonylphenyl)-1,2'-biimidazole, 2,2'-bis(2,4,6-tribromophenyl)-4,4',5,5'-tetrakis(4-methoxycarbonylphenyl)-1,2'-biimidazole, 2,2'-bis(2,4,6-tribromophenyl)-4,4',5,5'-tetrakis(4-ethoxycarbonylphenyl)-1,2'-biimidazole, 2,2'-bis(2,4,6-tribromophenyl)-4,4',5,5'-tetrakis(4-phenoxycarbonylphenyl)-1,2'-biimidazole, 2,2'-bis(2-cyanophenyl)-4,4',5,5'-tetrakis(4-methoxycarbonylphenyl)-1,2'-biimidazole, 2,2'-bis(2-cyanophenyl)-4,4',5,5'-tetrakis(4-ethoxycarbonylphenyl)-1,2'biimidazole, 2,2'-bis(2-cyanophenyl)-4,4',5,5'-tetrakis(4-phenoxycarbonylphenyl)-1,2'-biimidazole, 2,2'-bis(2-methylphenyl)-4,4',5,5'-tetrakis(4-methoxycarbonylphenyl)-1,2'-biimidazole, 2,2'-bis(2-methylphenyl)-4,4',5,5'-tetrakis(4-ethoxycarbonylphenyl)-1,2'-biimidazole, 2,2'-bis(2-methylphenyl)-4,4',5,5'-tetrakis(4-phenoxycarbonylphenyl)-1,2'-biimidazole, 2,2'-bis(2-ethylphenyl)-4,4',5,5'-tetrakis(4-methoxycarbonylphenyl)-1,2'-biimidazole, 2,2'-bis(2-ethylphenyl)-4,4',5,5'-tetrakis(4- ethoxycarbonylphenyl)-1,2'-biimidazole, 2,2'-bis(2-ethylphenyl)-4,4',5,5'-tetrakis(4-phenoxycarbonylphenyl)-1,2'-biimidazole, 2,2'-bis(2-phenylphenyl)-4,4',5,5'-tetrakis(4-methoxycarbonylphenyl)-1,2'-biimidazole, 2,2'-bis(2-phenylphenyl)-4,4',5,5'-tetrakis(4-ethoxycarbonylphenyl)-1,2'-biimidazole, 2,2'-bis(2-phenylphenyl)-4,4',5,5'-tetrakis(4-phenoxycarbonylphenyl)-1,2'-biimidazole, 2,2'-bis(2-chlorophenyl)-4,4',5,5'-tetraphenyl-1,2'-biimidazole, 2,2'-bis(2,4-dichlorophenyl)-4,4',5,5'-tetraphenyl-1,2'-biimidazole, 2,2'-bis(2,4,6-trichlorophenyl)-4,4',5,5'-tetraphenyl-1,2'-biimidazole, 2,2'-bis(2-bromophenyl)-4,4',5,5'-tetraphenyl-1,2'-biimidazole, 2,2'-bis(2,4-dibromophenyl)-4,4',5,5'-tetraphenyl-1,2'-biimidazole, 2,2'-bis(2,4,6-tribromophenyl)-4,4',5,5'-tetraphenyl-1,2'-biimidazole, 2,2'-bis(2-cyanophenyl)-4,4',5,5'-tetraphenyl-1,2'-biimidazole, 2,2'-bis(2,4-dicyanophenyl)-4,4',5,5'-tetraphenyl-1,2'-biimidazole, 2,2'-bis(2,4,6-tricyanophenyl)-4,4',5,5'-tetraphenyl-1,2'-biimidazole, 2,2'-bis(2-methylphenyl)-4,4',5,5'-tetraphenyl-1,2'-biimidazole, 2,2'-bis(2,4-dimethylphenyl)-4,4',5,5'-tetraphenyl-1,2'-biimidazole, 2,2'-bis(2,4,6-trimethylphenyl)-4,4',5,5'-tetraphenyl-1,2'-biimidazole, 2,2'-bis(2-ethylphenyl)-4,4',5,5'-tetraphenyl-1,2'-biimidazole, 2,2'-bis(2,4-diethylphenyl)-4,4',5,5'-tetraphenyl-1,2'-biimidazole, 2,2'-bis(2,4,6-triethylphenyl)-4,4',5,5'-tetraphenyl-1,2'-biimidazole, 2,2'-bis(2-phenylphenyl)-4,4',5,5'-tetraphenyl-1,2'-biimidazole, 2,2'-bis(2,4-diphenylphenyl)-4,4',5,5'-tetraphenyl-1,2'-biimidazole, 2,2'-bis(2,4,6-triphenylphenyl)-4,4',5,5'-tetraphenyl-1,2'-biimidazole, and the like.

Of these biimidazole compounds, particularly preferred are 2,2'-bis(2-chlorophenyl)-4,4',5,5'-tetrakis(4-ethoxycarbonylphenyl)-1,2'-biimidazole, 2,2'-bis(2-bromophenyl)-4,4',5,5'-tetrakis(4-ethoxycarbonylphenyl)-1,2'-biimidazole, 2,2'-bis(2,4-dichlorophenyl)-4,4',5,5'-tetraphenyl-1,2'-biimidazole, 2,2'-bis(2,4,6-trichlorophenyl)-4,4',5,5'-tetraphenyl-1,2'-biimidazole, 2,2'-bis(2,4-dibromophenyl)-4,4',5,5'-tetraphenyl-1,2'-biimidazole and 2,2'-bis(2,4,6-tribromophenyl)-4,4',5,5'-tetraphenyl-1,2'-biimidazole.

The above biimidazole compounds have excellent solubility in a solvent, do not produce foreign matter such as undissolved products or deposits, are very sensitive, promote a curing reaction thoroughly by exposure with a small amount of energy, give high contrast and do not cause a curing reaction in unexposed portions. Therefore, after exposure, the coating film is clearly divided into cured portions insoluble in a developer and uncured portions highly soluble in the developer, whereby a pixel pattern having no undercut can be obtained and a very fine array of pixels arranged according to a predetermined pattern can be formed.

Specific examples of the above benzoin compounds include benzoin, benzoin methyl ether, benzoin ethyl ether, benzoin i-propyl ether, benzoin i-butyl ether, methyl-2-benzoyl benzoate and the like.

Specific examples of the above acetophenone compounds include 2,2-dimethoxy-2-phenylacetophenone, 2-hydroxy-2-methyl-1-phenylpropan-1-one, 1-(4-i-propylphenyl)-2-hydroxy-2-methylpropan-1-one, 4-(2-hydroxyethoxy)phenyl-(2-hydroxy-2-propyl)ketone, 2,2-dimethoxyacetophenone, 2,2-diethoxyacetophenone, 2-methyl-(4-methylthiophenyl)-2-morpholino-1-propan-1-one, 2-benzyl-2-dimethylamino-1-(4-morpholinophenyl)butan-1-one, 1-hydroxycyclohexylphenyl ketone, 2,2'-dimethoxy-1,2-diphenylethan-1-one, 4-azidoacetophenone, 4-azidobenzalacetophenone and the like.

Specific examples of the above benzophenone compounds include benzophenone, 4,4'-bis(dimethylamino) benzophenone, 4,4'-bis(diethylamino)benzophenone, 3,3'-dimethyl-4-methoxybenzophenone and the like.

Specific examples of the α-diketone compounds include diacetyl, dibenzoyl, methylbenzoyl formate and the like.

Specific examples of the above polynuclear quinone compounds include anthraquinone, 2-ethylanthraquinone, 2-t-butylanthraquinone, 1,4-naphthoquinone and the like.

Specific examples of the above xanthone compounds include xanthone, thioxanthone, 2,4-diethylthioxanthone, 2-chlorothioxanthone and the like.

Specific examples of the above diazo compounds include 4-diazodiphenylamine, 4-diazo-4'-methoxydiphenylamine, 4-diazo-3-methoxydiphenylamine and the like.

Specific examples of the above triazine compounds include 2-(2'-furylethylidene)-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(2'-bromo-4'-methylphenyl)- 4,6-bis(trichloromethyl)-s-triazine, 2-(2'-thiophenylethylidene)-4,6-bis(trichloromethyl)-s-triazine and the like.

Photopolymerization initiators other than the above photopolymerization initiators include 4-azidobenzaldehyde, azidopyrene, bis(2,6-dimethoxybenzoyl)-2,4,4-trimethylpentylphosphine oxide, N-phenylthioacridone, triphenylpyrylium perchlorate and the like.

These photopolymerization initiators may be used alone or in admixture of two or more.

The amount of the photopolymerization initiator used in the present invention is preferably 0.01 to 200 parts by weight, more preferably 1 to 120 parts by weight, particularly preferably 1 to 50 parts by weight, based on 100 parts by weight of the total of the polyfunctional monomer (C) and the monofunctional monomer which is used as the case may be. When the amount of the photopolymerization initiator is smaller than 0.01 part by weight, curing by exposure may not proceed thoroughly, whereby it may be difficult to obtain an array of pixels arranged according to a predetermined pattern. On the other hand, when the amount is larger than 200 parts by weight, the formed pixels easily fall off from the substrate at the time of development, and stains or film residues are liable to be produced in an area other than a portion where the pixels are formed on the substrate.

In the present invention, at least one of a sensitizer, curing accelerator and polymer photocrosslinking-sensitizing agent (to be comprehensively referred to as "curing aid" hereinafter) may be further used in conjunction with the above photopolymerization initiator as required.

Specific examples of the sensitizer include 4-diethylaminoacetophenone, 4-dimethylaminopropiophenone, ethyl-4-dimethylaminobenzoate, 2-ethylhexyl-1,4-dimethylaminobenzoate, 2,5-bis(4'-diethylaminobenzal)cyclohexanone, 7-diethylamino-3-(4-diethylaminobenzoyl)coumarin, 4-(diethylamino)chalcone and the like.

These sensitizers may be used alone or in admixture of two or more.

Specific examples of the curing accelerator include chain transfer agents such as 2-mercaptobenzoimidazole, 2-mercaptobenzothiazole, 2-mercaptobenzooxazole, 2,5-dimercapto-1,3,4-thiadiazole, 2-mercapto-4,6-dimethylaminopyridine, 1-phenyl-5-mercapto-1H-tetrazole and 3-mercapto-4-methyl-4H-1,2,4-triazole.

These curing accelerators may be used alone or in admixture of two or more.

The above polymer photocrosslinking sensitizing agent is a polymer compound which can serve as a crosslinking agent and/or sensitizer when exposed to radiation and which has at least one functional group in the main chain and/or side chain. Specific examples thereof include condensates of 4-azidobenzaldehyde and polyvinyl alcohols, condensates of 4-azidobenzaldehyde and phenolic novolak resins, homopolymers and copolymers of 4-acryloylphenylcinnamoyl esters, 1,4-polybutadiene, 1,2-polybutadiene and the like.

These polymer photocrosslinking-sensitizing agents may be used alone or in admixture of two or more.

The amount of the curing aid used is preferably 300 parts by weight or less, more preferably 5 to 200 parts by weight, particularly preferably 10 to 100 parts by weight, based on 100 parts by weight of the photopolymerization initiator (D).

In the present invention, a combination of a biimidazole compound and a benzophenone compound as a photopolymerization initiator and/or a thiazole curing accelerator is particularly preferably used because the formed pixels rarely fall off from the substrate at the time of development and the strength and sensitivity of the pixels are high.

In the present invention, when a combination of a biimidazole compound and other component is used as a photopolymerization initiator, the proportion of the other component is preferably 80 wt % or less based on the whole photopolymerization initiator.

Combinations of the constituent components of particularly preferred photopolymerization initiators are as follows.

That is, they are 2,2'-bis(2-chlorophenyl)-4,4',5,5'-tetrakis(4-ethoxycarbonylphenyl)-1,2'-biimidazole/4,4'-bis(diethylamino)benzophenone, 2,2'-bis(2-chlorophenyl)-4,4',5,5'-tetrakis(4-ethoxycarbonylphenyl)-1,2'-biimidazole/4,4'-bis(diethylamino)benzophenone/2-benzyl-2-dimethylamino-1-(4-morpholinophenyl)butan-1-one, 2,2'-bis(2-chlorophenyl)-4,4',5,5'-tetrakis(4-ethoxycarbonylphenyl)-1,2'-biimidazole/4,4'-bis(diethylamino)benzophenone/1-hydroxycyclohexylphenyl ketone, 2,2'-bis(2-chlorophenyl)-4,4',5,5'-tetrakis(4-ethoxycarbonylphenyl)-1,2'-biimidazole/4,4'-bis(dimethylamino)benzophenone/1-hydroxycyclohexylphenyl ketone/2-mercaptobenzothiazole, 2,2'-bis(2,4-dichlorophenyl)-4,4',5,5'-tetraphenyl-1,2'-biimidazole/4,4'-bis(diethylamino)benzophenone, 2,2'-bis(2,4-dichlorophenyl)-4,4',5,5$^1$-tetraphenyl-1,2'-biimidazole/4,4'-bis(diethylamino)benzophenone/2-benzyl-2-dimethylamino-1-(4-morpholinophenyl)butan-1-one, 2,2'-bis(2,4-dichlorophenyl)-4,4',5,5'-tetraphenyl-1,2'-biimidazole/4,4'-bis(diethylamino)benzophenone/2-benzyl-2-dimethylamino-1-(4-morpholinophenyl)butan-1-one/2-mercaptobenzothiazole, 2,2'-bis(2,4-dibromophenyl)-4,4',5,5'-tetraphenyl-1,2'-biimidazole/4,4'-bis (diethylamino)benzophenone/2-benzyl-2-dimethylamino-1-(4-morpholinophenyl)butan-1-one, 2,2'-bis(2,4-dibromophenyl)-4,4',5,5'-tetraphenyl-1,2'-biimidazole/4,4'-bis(diethylamino)benzophenone/1-hydroxycyclohexylphenyl ketone, and 2,2'-bis(2,4,6-trichlorophenyl)-4,4',5,5'-tetraphenyl-1,2'-biimidazole/4,4'-bis(dimethylamino)benzophenone/1-hydroxycyclohexylphenyl ketone/2-mercaptobenzothiazole.

As described above, the second radiation sensitive composition of the present invention comprises (A) a colorant, (B) an alkali-soluble resin, (C) a polyfunctional monomer, (D) a photopolymerization initiator and (E) an organic amino compound having at least one amino group in the molecule and a molecular weight of 1,000 or less.

Of these, the same components as those listed above can be used as the components (A), (B), (C) and (D) in the same amounts as the preferred amounts described for the first radiation sensitive composition. A description is subsequently given of the component (E).

(E) Organic Amino Compound

The organic amino compound in the present invention is a compound having at least one amino group in the molecule and a molecular weight of 1,000 or less (to be referred to as "organic amino compound (E)" hereinafter).

The organic amino compound (E) is preferably an aliphatic amine or phenyl group-containing amine.

Illustrative examples of the aliphatic amine include mono(cyclo)alkyl amines such as n-propylamine, isopropylamine, n-butylamine, isobutylamine, t-butylamine, n-pentylamine, n-hexylamine, n-heptylamine, n-octylamine, n-nonylamine, n-decylamine, n-undecylamine, n-dodecylamine, cyclohexylamine, o-methylcycLohexylamine, m-methylcyclohexylamine, p-methylcyclohexylamine, o-ethylcyclohexylamine, m-ethylcyclohexylamine and p-ethylcyclohexylamine; di(cyclo)alkyl amines such as methyl ethylamine, diethylamine, methyl n-propylamine, ethyl n-propylamine, di-n-propylamine, diisopropylamine, di-n-butylamine, diisobutylamine, di-t-butylamine, di-n-pentylamine, di-n-hexylamine, methyl cyclohexylamine, ethyl cyclohexylamine and dicyclohexylamine; tri(cyclo)alkyl amines such as dimethyl ethylamine, methyl diethylamine, triethylamine, dimethyl n-propylamine, diethyl n-propylamine, methyl di-n-propylamine, ethyl di-n-propylamine, tri-n-propylamine, triisopropylamine, tri-n-butylamine, triiscbutylamine, tri-t-butylamine, tri-n-pentylamine, tri-n-hexylamine, dimethyl cyclohexylamine, diethyl cyclohexylamine, methyl dicyclohexylamine, ethyl dicyclohexylamine and tricyclohexylamine; mono(cyclo)alkanol amines such as 2-aminoethanol, 3-amino-1-propanol, 1-amino-2-propanol, 4-amino-1-butanol, 5-amino-1-pentanol, 6-amino-1-hexanol and 4-amino-1-cyclohexanol; di(cyclo)alkanol amines such as diethanolamine, di-n-propanolamine, diisopropanolamine, di-n-butanolamine, diisobutanolamine, di-n-pentanolamine, di-n-hexanolamine and di(4-cyclohexanol)amine; tri(cyclo)alkanol amines such as triethanolamine, tri-n-propanolamine, triisopropanolamine, tri-n-butanolamine, triisobutanolamine, tri-n-pentanolamine, tri-n-hexanolamine and tri(4-cyclohexanol)amine; amino(cyclo)alkane diols such as 3-amino-1,2-propanediol, 2-amino-1,3-propanediol, 4-amino-1,2-butanediol, 4-amino-1,3-butanediol, 4-amino-1,2-cyclohexanediol, 4-amino-1,3-cyclohexanediol, 3-dimethylamino-1,2-propanediol, 3-diethylamino-1,2-propanediol, 2-dimethylamino-1,3-propanediol and 2-diethylamino-1,3-propanediol; amino group-containing cycloalkane methanols such as 1-aminocyclopentane methanol, 4-aminocyclopentane methanol, 1-aminocyclohexane methanol, 4-aminocyclohexane methanol, 4-dimethylaminocyclopentane methanol, 4-diethylaminocyclopentane methanol, 4-dimethylaminocyclohexane methanol and 4-diethylaminocyclohexane methanol; aminocarboxylic acids such as β-alanine, 2-aminobutyric acid, 3-aminobutyric acid, 4-aminobutyric acid, 2-aminoisobutyric acid, 3-aminoisobutyric acid, 2-aminovaleric acid, 5-aminovaleric acid, 6-aminocaproic acid, 1-aminocyclopropanecarboxylic acid, 1-aminocyclohexanecarboxylic acid and 4-aminocyclohexanecarboxylic acid; and the like.

The phenyl group-containing amine is, for example, a compound having an amino group directly bonded to a phenyl group, a compound having an amino group bonded to a phenyl group through a carbon chain, or the like. Of these, particularly preferred is a compound having an amino group directly bonded to a phenyl group. Illustrative examples of the compound having an amino group directly bonded to a phenyl group include aromatic amines such as aniline, o-methylaniline, m-methylaniline, p-methylaniline, p-ethylaniline, p-n-propyl aniline, p-isopropylaniline, p-n-butylaniline, p-t-butylaniline, 1-naphthylamine, 2-naphthylamine, N,N-dimethylaniline, N,N-diethylaniline and p-methyl-N,N-dimethylaniline; aminobenzyl alcohols such as o-aminobenzyl alcohol, m-aminobenzyl alcohol, p-aminobenzyl alcohol, p-dimethylaminobenzyl alcohol and p-diethylaminobenzyl alcohol; aminophenols such as o-aminophenol, m-aminophenol, p-aminophenol, p-dimethylaminophenol and p-diethylaminophenol; aminobenzoic acids (derivatives) such as m-aminobenzoic acid, p-aminobenzoic acid, p-dimethylaminobenzoic acid and p-diethylaminobenzoic acid; and the like.

Of these organic amino compounds (E), preferred aliphatic amines are mono(cyclo)alkanol amines and amino (cyclo)alkane diols, out of which 2-aminoethanol, 3-amino-1-propanol, 5-amino-1-pentanol, 3-amino-1,2-propanediol, 2-amino-1,3-propanediol and 4-amino-1,2-butanediol are particularly preferred. Preferred phenol group-containing amines are amino phenols, out of which o-aminophenol, m-aminophenol and p-aminophenol are particularly preferred.

In the present invention, these organic amino compounds (E) may be used alone or in admixture of two or more.

The amount of the organic amino compound (E) used in the present invention is preferably 0.001 to 15 wt %, more preferably 0.01 to 10 wt % of the composition. When the amount of the organic amino compound (E) is smaller than 0.001 wt %, the effect of preventing scum or stains on the substrate or the light screening layer of Unexposed portions at the time of development is liable to diminish. On the other hand, when the amount is larger than 15 wt %, adhesion between the pixels and the substrate deteriorates and the formed pixels may fall off from the substrate easily.

Other Additives

The radiation sensitive composition of the present invention can contain an organic acid to further improve its solubility in an alkali developer and to further suppress the generation of undissolved products after development.

The organic acid is preferably an aliphatic carboxylic acid or phenyl group-containing carboxylic acid having a molecular weight of 1,000 or less.

Specific examples of the aliphatic carboxylic acid include monocarboxylic acids such as formic acid, acetic acid, propionic acid, butyric acid, valeric acid, pivalic acid, caproic acid, diethylacetic acid, enanthic acid and caprylic acid; dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, cyclohexanedicarboxylic acid, itaconic acid, citraconic acid, maleic acid, fumaric acid and mesaconic acid; tricarboxylic acids such as tricarballylic acid, aconitic acid and camphoronic acid; and the like.

The phenyl group-containing carboxylic acid is an aromatic carboxylic acid having a carboxyl group directly bonded to a phenyl group or a carboxylic acid having a carboxyl group bonded to a phenyl group through a carbon chain.

Specific examples of the phenyl group-containing carboxylic acid include aromatic monocarboxylic acids such as benzoic acid, toluic acid, cuminic acid, hemellitic acid and mesitylenic acid; aromatic dicarboxylic acids such as phthalic acid, isophthalic acid and terephthalic acid; aromatic polycarboxylic acids having a valence of 3 or more such as trimellitic acid, trimesic acid, mellophanic acid and pyromellitic acid; and others such as phenylacetic acid, hydroatropic acid, hydrocinnamic acid, mandelic acid, phenylsuccinic acid, atropic acid, cinnamic acid, cinnamylidenic acid, coumaric acid and umbellic acid.

Of these organic acids, aliphatic dicarboxylic acids and aromatic dicarboxylic acids such as malonic acid, adipic acid, itaconic acid, citraconic acid, fumaric acid, mesaconic acid and phthalic acid are preferred from the viewpoint of alkali solubility, solubility in a solvent and the prevention of stains and film residues in an area other than a portion where pixels are formed on the substrate.

The above organic acids may be used alone or in admixture of two or more.

The amount of the organic acid used is preferably 10 wt % or less, more preferably 5 wt % or less, particularly preferably 1 wt % or less, based on the whole radiation sensitive composition. When the amount of the organic acid is larger than 10 wt %, the adhesion of the formed pixels to the substrate is liable to deteriorate.

The radiation sensitive composition of the present invention can further contain additives other than the above organic acids.

Illustrative examples of the additives include dispersion aids such as blue pigment derivatives and yellow pigment derivative exemplified by copper phthalocyanine derivatives; fillers such as; glass and alumina; polymer compounds such as polyvinyl alcohols, polyethylene glycol monoalkyl ethers and poly(fluoroalkylacrylates); adhesion accelerators such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidylpropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane and 3-mercaptopropyltrimethoxysilane; antioxidants such as 2,2-thiobis(4-methyl-6-t-butylphenol) and 2,6-di-t-butylphenol; ultraviolet absorbers such as 2-(3-t-butyl-5-methyl-2-hydroxyphenyl)-5-chlorobenzotriazole and alkoxybenzophenone; agglomeration inhibitors such as sodium polyacrylate; heat crosslinking agents such as epoxy compounds, melamine compounds and bisazido compounds; and the like.

Solvent

The radiation sensitive composition of the present invention comprises the above components (A) to (D) as essential ingredients and the above other additives as the case may be, and is generally prepared as a liquid composition by adding a solvent.

Any solvent can be properly selected for use as long as it dissolves or disperses the above components forming the radiation sensitive composition, does not react with these components and exhibits appropriate volatility.

Specific examples of the solvent include (poly)alkylene glycol monoalkyl ethers such as ethylene glycol monomethyl ether, ethylene glycol monoethyl ether, ethylene glycol mono-n-propyl ether, ethylene glycol mono-n-butyl ether, diethylene glycol mononiethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether and tripropylene glycol monoethyl ether; (poly)alkylene glycol monoalkyl ether acetates such as ethylene glycol monomethyl ether acetate, ethylene glycol monoethyl ether acetate, propylene glycol monomethyl ether acetate and propylene glycol monoethyl ether acetate; other ethers such as diethylene glycol dimethyl ether, diethylene glycol methylethyl ether, diethylene glycol diethyl ether and tetrah-ydrofuran; ketones such as methyl ethyl ketone, cyclohexanone, 2-heptanone and 3-heptanone; alkyl lactates such as methyl 2-hydroxypropionic acid and ethyl 2-hydroxypropionic acid; other esters such as ethyl 2-hydroxy-2-methylpropionic acid, methyl 3-methoxypropionic acid, ethyl 3-methoxypropionic acid, methyl 3-ethoxypropionic acid, ethyl 3-ethoxypropionic acid, ethyl ethoxyacetic acid, ethyl hydroxyacetic acid, methyl 2-hydroxy-3-methylbutanoic acid, 3-methyl-3-methoxybutyl acetate, 3-methyl-3-methoxybutyl propionate, ethyl acetate, n-butyl acetate, i-butyl acetate, n-amyl formate, i-amyl acetate, n-butyl propionate, i-propyl butyrate, ethyl butyrate, n-butyl butyrate, methyl pyruvate, ethyl pyruvate, n-propyl pyruvate, methyl acetoacetate, ethyl acetoacetate and ethyl 2-oxobutanoic acid; aromatic hydrocarbons such as toluene and xylene; amides such as N-methylpyrrolidone, N,N-dimethylformamide and N,N-dimethylacetoamide; and the like.

Of these solvents, ethylene glycol monomethyl ether acetate, propylene glycol monomethyl ether, propylene glycol monomethyl ether acetate, propylene glycol monoethyl ether acetate, diethylene glycol dimethyl ether, diethylene glycol methyl ethyl ether, cyclohexanone, 2-heptanone, 3-heptanone, ethyl 2-hydroxypropionic acid, 3-methyl-3-methoxybutyl propionate, ethyl 3-methoxypropionic acid, methyl 3-ethoxypropionic acid, ethyl 3-ethoxypropionic acid, n-butyl acetate, i-butyl acetate, n-amyl formate, i-amyl acetate, n-butyl propionate, ethyl butyrate, i-propyl butyrate, n-butyl butyrate and ethyl pyruvate are preferred from the viewpoint of solubility, pigment-dispersibility and coating properties.

These solvents may be used alone or in admixture of two or more.

The solvent can be used in conjunction with a high-boiling solvent such as benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate or phenyl cellosolve acetate.

Of these high-boiling solvents, γ-butyrolactone is preferred.

These high-boiling solvents may be used alone or in admixture of two or more.

The amount of the solvent used is not particularly limited but is desirably such that the total amount of components contained in the composition excluding the solvent should be preferably 5 to 50 wt %, more preferably 10 to 40 wt %, from the viewpoint of the coasting properties, stability and the like of the obtained radiation sensitive composition.

Method of Forming Color Filter

A description is subsequently given of a method of forming a color filter using the radiation sensitive composition of the present invention.

A light screening layer is first formed on the surface of a substrate as required to define a portion for forming pixels. A liquid radiation sensitive composition having, for example, a red pigment dispersed therein is coated on this substrate, and the coated substrate is prebaked to evaporate the solvent. Thus, a coating film is formed. Thereafter, the coating film is exposed to radiation through a photomask and developed with an alkali developer to dissolve and remove unexposed portions of the coating film. The resulting coating film is then post-baked to form an array of red pixels arranged in a predetermined pattern.

Thereafter, liquid radiation sensitive compositions having green and blue pigments dispersed therein are coated on the substrate, which is then prebaked and exposed to radiation to form a coating film, which is then developed and post-baked in the same manner as described above to form arrays of green pixels and blue pixels on the same substrate sequentially. Thus, a color filter having arrays of red, green and blue pixels arranged on the substrate is obtained.

The substrate used to form the color filter is made from glass, silicon, polycarbonate, polyester, aromatic polyamide, polyamide imide, polyimide or the like. The substrate may be subjected to a proper pre-treatment such as chemical treatment with a silane coupling agent or the like, plasma treatment, ion plating, sputtering, gas vapor reaction process or vacuum deposition.

To coat the liquid radiation sensitive composition on the substrate, rotation coating, cast coating, roll coating or the like can be suitably employed.

The thickness of the dried coating film is preferably 0.1 to 10 $\mu$m, more preferably 0.2 to 5.0 $\mu$m, particularly preferably 0.2 to 3.0 $\mu$m.

The radiation used to form a color filler is selected, for example, from visible light, ultraviolet light, far ultraviolet light, electron beans, X-rays and the like. It preferably has a wavelength of 190 to 450 nm.

The irradiation energy of the radiation is preferably 1 to 1,000 mJ/cm$^2$.

The alkali developer is preferably an aqueous solution of sodium carbonate, sodium hydroxide, potassium hydroxide, tetramethylammonium hydroxide, choline, 1,8-diazabicyclo-[5.4.0]-7-undecene, 1,5-diazabicyclo-[4.3.0]-5-nonene or the like.

To the alkali developer may be added a water-soluble organic solvent such as methanol or ethanol and a surfactant in suitable amounts. The alkali developer is generally washed with water.

Development is carried out by shower development, spray development, dip development, puddle development or the like at normal temperature for 5 to 300 seconds.

The thus formed color filter is extremely useful for transmission-type and reflection-type color liquid crystal display devices, color image pick-up elements, color sensors and the like.

The following examples are provided for the purpose of further illustrating the present invention, although the present invention is in no way restricted thereto. "Parts" and "%" in the following examples are based on weight.

EXAMPLE 1

A liquid radiation sensitive composition (R1) was prepared by mixing 130 parts by weight of C.I. Pigment Red 177 as the colorant (A), 60 parts by weight of a copolymer of methacrylic acid/glycerol monomethacrylate/styrene/benzyl methacrylate/N-phenylmaleimide (weight ratio of 15/10/15/35/25, weight average molecular weight=28,000) as the alkali-soluble resin (B), 40 parts by weight of dipentaerythritol hexaacrylate as the polyfunctional monomer (C), 10 parts by weight of 2,2'-bis(2,4-dichlorophenyl)-4,4',5,5'-tetraphenyl-1,2'-biimidazole, 10 parts by weight of 4,4'-bis(diethylamino)benzophenone and 50 parts by weight of 2-benzyl-2-dimethylamino-1-(4-morpholinophenyl)butan-1-one as the photopolymerization initiator (1)) and 1,000 parts by weight of ethyl 3-ethoxypropionic acid as a solvent. The concentration of the colorant (A) based on the total weight of the components of the liquid composition excluding the solvent was about 43 wt %.

<formation of color filter>

The above liquid composition was coated on the surface of a soda glass substrate covered with a $SiO_2$ film for preventing the elution of sodium ions with a spin coater, and the coated substrate was prebaked at 80° C. for 10 minutes to form a 2.0-μm-thick coating film.

Thereafter, the substrate was cooled to room temperature, and the coating film was exposed to 100 mJ/cm$^2$ of ultra-violet light having wavelengths of 365 nm, 405 nm and 436 nm through a photomask using a high-pressure mercury lamp. The substrate was then immersed in a 0.04-wt % aqueous solution of potassium hydroxide heated at 23° C. for 1 minute for development, washed with ultra-purified water and dried with air. The substrate was further post-baked in a clean oven heated at 230° C. for 30 minutes to form a red-striped color filter on the substrate.

When the obtained color filter was observed through an optical microscope, no scum was seen on the substrate and a light screening layer of unexposed portions. When it was observed using a projector, no stains were also seen on the substrate and the light screening layer of unexposed portions. Further, when the surface of the substrate of unexposed portions was rubbed 10 times with Tracy (trade name, a lens cleaner of Toray Industries, Inc.) impregnated with ethanol, the Tracy was not stained with red. In addition, adhesion between the pixels of this color filter and the substrate was excellent.

Comparative Example 1

A liquid radiation sensitive composition (r1) was prepared in the same manner as in Example 1 except that 60 parts by weight of a copolymer of methacrylic acid/2-hydroxyethyl methacrylate/benzyl methacrylate (weight ratio=15/15/70, weight average molecular weight=28,000) was used in place of 60 parts by weight of the alkali-soluble resin (B) used in Example 1, and a red-striped color filter was formed on a substrate.

When the obtained color filter was observed through an optical microscope, scum was seen on the substrate and a light screening layer of unexposed portions. When it was observed using a projector, stains were also seen on the substrate and the light screening layer of unexposed portions. Further, when the surface of the substrate of unexposed portions of the color filter was rubbed 10 times with the Tracy impregnated with ethanol, the Tracy was stained with red.

Comparative Example 2

A liquid composition (g1) was prepared by mixing 110 parts by weight of a mixture of C.I. Pigmert Green 36 and C.I. Pigment Yellow 150 (weight ratio=60/40) as the colorant (A), 50 parts by weight of a copolymer of methacrylic acid/styrene/benzyl methacrylate/glycerol monomethacrylate/N-phenylmaleimide (weight ratio=15/15/35/10/25, Mw=20,000, Mn=10,000) as the alkali-soluble resin (B), 50 parts by weight of dipentaerythritol hexaacrylate as the polyfunctional monomer (C), 5 parts by weight of 2,2'-bis(2,4-dichlorophenyl)-4,4',5,5'-tetraphenyl-1,2'-biimidazole, 5 parts by weight of 4,4'-bis(diethylamino)benzophenone and 50 parts by weight of 2-benzyl-2-dimethylamino-1-(4-morpholinophenyl)butan-1-one as the photopolymerization initiator (D) and 1,000 parts by weight of a mixture of ethyl 3-ethoxypropionic acid and cyclohexanone (weight ratio=90/10) as a solvent.

The above liquid composition (g1) was coated on the surface of a chromium substrate with a spin coater, and the coated substrate was prebaked on a hot plate heated at 100° C. for 2.5 minutes to form a 1.8-μm-thick coating film.

Thereafter, the substrate was cooled to room temperature and the coating film was exposed to 200 mJ/cm$^2$ of ultra-violet light having wavelengths of 365 nm, 405 nm and 436 nm through a photomask using a high-pressure mercury lamp. The substrate was then immersed in a 0.04-wt % aqueous solution of potassium hydroxide heated at 23°C. for 1 minute for development, washed with ultra-purified water and dried with air. The substrate was further post-baked in a clean oven heated at 230° C. for 30 minutes to form a green striped color filter on the substrate.

When the obtained color filter was observed using a projector, semi-opaque stains were seen on the substrate of unexposed portions.

EXAMPLE 2

A liquid composition (G1) was prepared by mixing 110 parts by weight of a mixture of C.I. Pigment Green 36 and C.I. Pigment Yellow 150 (weight ratio=60/40) as the colorant (A), 50 parts by weight of a copolymer of methacrylic acid/styrene/benzyl methacrylete/glycerol monomethacrylate/N-phenylmaleimide (weight ratio of 15/15/35/10/25, Mw=20,000, Mn=10,000) as the alkali-soluble resin (B), 50 parts by weight of dipentaerythritol hexaacrylate as the polyfunctional monomer (C), 5 parts by weight of 2,2'-bis(2,4-dichlorophenyl)-4,4',5,5'-tetraphenyl-1,2'-biimidazole, 5 parts by weight of 4,4'-bis(diethylamino)benzophenone and 50 parts by weight of 2-benzyl-2-dimethylamino-1-(4-morpholinophenyl)butan-1-one as the photopolymerization initiator (D) and 1,000 parts by weight of a mixture of ethyl 3-ethoxypropionic acid and cyclohexanone (weight ratio=90/10) as a solvent.

This liquid composition (G1) was coated on the surface of a chromium substrate with a spin coater, and the coated substrate was prebaked on a hot plate heated at 100° C. for 2.5 minutes to form a 1.8-μm-thick coating film.

Thereafter, the substrate was cooled to room temperature and the coating film was exposed to 200 mJ/cm$^2$ of ultra-violet light having wavelengths of 365 nm, 405 nm and 436 nm through a photomask using a high-pressure mercury lamp. The substrate was then immersed in a 0.04-wt % aqueous solution of potassium hydroxide heated at 23° C. for 1 minute for development, washed with ultra-purified water and dried with air. The substrate was further post-baked in a clean oven heated at 230° C. for 30 minutes to form a green-striped color filter on the substrate.

When the obtained color filter was observed using a projector, no stains were seen on the substrate of unexposed portions. In addition, adhesion between the obtained pixels and the substrate was excellent.

EXAMPLE 3

A liquid composition (G2) was prepared by mixing 110 parts by weight of a mixture of C.I. Pigment Green 36 and C.I. Pigment Yellow 150 (weight ratio=60/40) as the colorant (A), 50 parts by weight of a copolymer of methacrylic acid/styrene/benzyl methacrylate/glycerol monomethacrylate/N-phenylmaleimide (weight ratio of 15/15/35/10/25, Mw=20,000, Mn=10,000) as the alkali-soluble resin (B), 50 parts by weight of dipentaerythritol hexaacrylate as the polyfunctional monomer (C), 5 parts by weight of 2,2'-bis(2,4-dichlorophenyl)-4,4',5,5'-tetraphenyl-1,2'-biimidazole, 5 parts by weight of 4,4'-bis(diethylamino) benzophenone and 50 parts by weight of 2-benzyl-2-dimethylamino-1-(4-morpholinophenyl)butan-1-one as the photopolymerization initiator (D), 5 parts by weight of 3-amino-1-propanol as the organic amino compound (E) and 1,000 parts by weight of a mixture of ethyl 3-ethoxypropionic acid and cyclohexanone (weight ratio= 90/10) as a solvent.

Thereafter, a green-striped color filter was formed on a substrate in the same manner as in Example 1 except that the liquid composition (G2) was used in place of the liquid composition (G1).

When the obtained color filter was observed using a projector, no stains were seen on the substrate of unexposed portions. In addition, adhesion between the obtained pixels and the substrate was excellent.

EXAMPLE 4

A liquid composition (G3) was prepared by mixing 110 parts by weight of a mixture of C.I. Pigment Green 36 and C.I. Pigment Yellow 150 (weight ratio=60/40) as the colorant (A), 50 parts by weight of a copolymer of methacrylic acid/styrene/benzyl methacrylate/glycerol monomethacrylate/N-phenylmaleimide (weight: ratio of 15/15/35/10/25, Mw=20,000, Mn=10,000) as the alkali-soluble resin (B), 50 parts by weight of dipentaerythritol hexaacrylate as the polyfunctional monomer (C), 5 parts by weight of 2,2'-bis(2,4-dichlorophenyl)-4,4',5,5'-tetraphenyl-1,2'-biimidazole, 5 parts by weight of 4,4'-bis(diethylamino) benzophenone and 50 parts by weight of 2-benzyl-2-dimethylamino-1-(4-morpholinophenyl)butan-1-one as the photopolymerization initiator (D), 5 parts by weight of 3-amino-1,2-propanediol as the organic amino compound (E) and 1,000 parts by weight of a mixture of ethyl 3-ethoxypropionic acid and cyclohexanone (weight ratio= 90/10) as a solvent.

Thereafter, a green-striped color filter was formed on a substrate in the same manner as in Example 1 except that the liquid composition (G3) was used in place of the liquid composition (G1).

When the obtained color filter was observed using a projector, no stains were seen on the substrate of unexposed portions. In addition, adhesion between the obtained pixels and the substrate was excellent.

EXAMPLE 5

A liquid composition (G4) was prepared by mixing 90 parts by weight of a mixture of C.I. Pigment Green 7 and C.I. Pigment Yellow 83 (weight ratio=65/35) as the colorant (A), 50 parts by weight of a copolymer of methacrylic acid/ styrene/benzyl methacrylate/glycerol monomethacrylate/N-phenylmaleimide (weight ratio of 15/15/35/10/25, Mw=20,000, Mn=10,000) as the alkali-soluble resin (B), 50 parts by weight of dipentaerythritol hexaacrylate as the polyfunctional monomer (C), 5 parts by weight of 2,2'-bis(2,4-dichlorophenyl)-4,4',5,5'-tetraphenyl-1,2'-biimidazole, 5 parts by weight of 4,4'-bis(diethylamino)benzophenone and 50 parts by weight of 2-benzyl-2-dimethylamino-1-(4-morpholinophenyl)butan-1-one as the photopolymerization initiator (D), 5 parts by weight of 2-aminoethanol as the organic amino compound (E) and 1,000 parts by weight of a mixture of ethyl 3-ethoxypropionic acid and cyclohexanone (weight ratio=90/10) as a solvent.

Thereafter, a green-striped color filter was formed on a substrate in the same manner as in Example 1 except that the liquid composition (G4) was used in place of the liquid composition (G1).

When the obtained color filter was observed using a projector, no stains were seen on the substrate of unexposed portions. In addition, adhesion between the obtained pixels and the substrate was excellent.

EXAMPLE 6

A liquid composition (G5) was prepared by mixing 90 parts by weight of a mixture of C.I. Pigment Green 7 and C.I. Pigment Yellow 83 (weight ratio=65/35) as the colorant (A), 50 parts by weight of a copolymer of methacrylic acid/2-hydroxyethyl methacrylate/benzyl methacrylate (weight ratio of 15/15/70, Mw=25,000, Mn=11,000) as the alkali-soluble resin (B), 50 parts by weight of dipentaerythritol hexaacrylate as the polyfunctional monomer (C), 5 parts by weight of 2,2'-bis(2,4-dichlorophenyl)-4,4',5,5'-tetraphenyl-1,2'-biimidazole, 5 parts by weight of 4,4'-bis(diethylamino) benzophenone and 50 parts by weight of 2-benzyl-2-dimethylamino-1-(4-morpholinophenyl)butan-1-one as the photopolymerization initiator (D), 5 parts by weight of 2-aminoethanol as the organic amino compound (E) and 1,000 parts by weight of a mixture of ethyl 3-ethoxypropionic acid and cyclohexanone (weight ratio= 90/10) as a solvent.

Thereafter, a green-striped color filter was formed on a substrate in the same manner as in Example 1 except that the liquid composition (G5) was used in place of the liquid composition (G1).

When the obtained color filter was observed using a projector, no stains were seen on the substrate of unexposed portions. In addition, adhesion between the obtained pixels and the substrate was excellent.

EXAMPLE 7

A liquid composition (G6) was prepared by mixing 90 parts by weight of a mixture of C.I. Pigment Green 7 and C.I. Pigment Yellow 83 (weight ratio=65/35) as the colorant (A), 50 parts by weight of a copolymer of methacrylic acid/2-hydroxyethyl methacrylate/benzyl methacrylate (weight ratio of 15/15/70, Mw=25,000, Mn=11,000) as the alkali-soluble resin (B), 50 parts by weight of dipentaerythritol hexaacrylate as the polyfunctional monomer (C), 5 parts by weight of 2,2'-bis(2,4-dichlorophenyl)-4,4',5,5'-tetraphenyl-1,2'-biimidazole, 5 parts by weight of 4,4'-bis(diethylamino) benzophenone and 50 parts by weight of 2-benzyl-2-dimethylamino-1-(4-morpholinophenyl)butan-1-one as the photopolymerization initiator (D), 5 parts by weight of p-aminophenol as the organic amino compound (E) and 1,000 parts by weight of a mixture of ethyl 3-ethoxypropionic acid and cyclohexanone (weight ratio 90/10) as a solvent.

Thereafter, a green-striped color filter was formed on a substrate in the same manner as in Example 1 except that the liquid composition (G6) was used in place of the liquid composition (G1).

When the obtained color filter was observed using a projector, no stains were seen on the substrate of unexposed portions. In addition, adhesion between the obtained pixels and the substrate was excellent.

EXAMPLE 8

A liquid composition (R2) was prepared by mixing 95 parts by weight of a mixture of C.I. Pigment Red 177 and C.I. Pigment Red 224 (weight ratio=50/50) as the colorant (A), 60 parts by weight of a copolymer of methacrylic acid/styrene/benzyl methacrylate/glycerol monomethacrylate/N-phenylmaleimide (weight ratio of 15/15/35/10/25, Mw=20,000, Mn=10,000) as the alkali-soluble resin (B), 40 parts by weight of dipentaerythritol hexaacrylate as the polyfunctional monomer (C), 5 parts by weight of 2,2'-bis(2,4-dichlorophenyl)-4,4',5,5'-tetraphenyl-1,2'-biimidazole, 5 parts by weight of 4,4'-bis(diethylamino) benzophenone and 30 parts by weight of 2-benzyl-2-dimethylamino-1-(4-morpholinophenyl)butan-1-one as the photopolymerization initiator (D), 5 parts by weight of 2-aminoethanol as the organic amino compound (E) and 1,000 parts by weight of a mixture of ethyl 3-ethoxypropionic acid and cyclohexanone (weight ratio= 90/10) as a solvent.

This liquid composition (R2) was coated on the surface of a chromium substrate with a spin coater, and the coated substrate was prebaked on a hot plate heated at 100° C. for 2.5 minutes to form a 1.8-$\mu$m-thick coating film.

Thereafter, the substrate was cooled to room temperature and the coating film was exposed to 100 mJ/cm$^2$ of ultraviolet light having wavelengths of 365 nm, 405 nm and 436 nm through a photomask using a high-pressure mercury lamp. The substrate was then immersed in a 0.04-wt % aqueous solution of potassium hydroxide heated at 23° C. for 1 minute for development, washed with ultra-purified water and dried with air. The substrate was further post-baked in a clean oven heated at 230° C. for 30 minutes to form a red-striped color filter on the substrate.

When the obtained color filter was observed using a projector, no stains were seen on the substrate of unexposed portions. In addition, adhesion between the obtained pixels and the substrate was excellent.

EXAMPLE 9

A liquid composition (R3) was prepared by mixing 95 parts by weight of a mixture of C.I. Pigment Red 177 and C.I. Pigment Yellow 83 (weight ratio=80/20) as the colorant (A), 60 parts by weight of a copolymer of methacrylic acid/styrene/benzyl methacrylate/glycerol monomethacrylate/N-phenylmaleimide (weight ratio of 15/15/35/10/25, Mw=20,000, Mn=10,000) as the alkali-soluble resin (B), 40 parts by weight of dipentaerythritol hexaacrylate as the polyfunctional monomer (C), 5 parts by weight of 2,2'-bis(2,4-dichlorophenyl)-4,4',5,5'-tetraphenyl-1,2'-biimidazole, 5 parts by weight of 4,4'-bis(diethylamino) benzophenone and 30 parts by weight of 2-benzyl-2-dimethylamino-1-(4-morpholinophenyl)butan-1-one as the photopolymerization initiator (D), 5 parts by weight of 3-amino-1-propanol as the organic amino compound (E) and 1,000 parts by weight of a mixture of ethyl 3-ethoxypropionic acid and cyclohexanone (weight ratio= 90/10) as a solvent.

Thereafter, a red-striped color filter was formed on a substrate in the same manner as in Example 7 except that the liquid composition (R3) was used in place of the liquid composition (R2).

When the obtained color filter was observed using a projector, no stains were seen on the substrate of unexposed portions. In addition, adhesion between the obtained pixels and the substrate was excellent.

EXAMPLE 10

A liquid composition (B1) was prepared by mixing 100 parts by weight of C.I. Pigment Blue 15:6 as the colorant (A), 50 parts by weight of a copolymer of methacrylic acid/styrene/benzyl methacrylate/glycerol monomethacrylate/N-phenylmaleimide (weight ratio of 15/15/35/10/25, Mw=20,000, Mn=10,000) as the alkali-soluble resin (B), 50 parts by weight of dipentaerythritol hexaacrylate as the polyfunctional monomer (C), 5 parts by weight of 2,2'-bis(2,4-dichlorophenyl)-4,4',5,5'-tetraphenyl-1,2'-biimidazole, 5 parts by weight of 4,4'-bis(diethylamino) benzophenone and 50 parts by weight of 2-benzyl-2-dimethylamino-1-(4-morpholinophenyl)butan-1-one as the photopolymerization initiator (D), 5 parts by weight of 5-amino-1-pentanol as the organic amino compound (E) and 1,000 parts by weight of a mixture of ethyl 3-ethoxypropionic acid and cyclohexanone (weight ratio= 90/10) as a solvent.

Thereafter, a blue-striped color filter was formed on a substrate in the same manner as in Example 1 except that the liquid composition (B1) was used in place of the liquid composition (G1).

When the obtained color filter was observed using a projector, no stains were seen on the substrate of unexposed portions. In addition, adhesion between the obtained pixels and the substrate was excellent.

EXAMPLE 11

A liquid composition (B2) was prepared by mixing 90 parts by weight of a mixture of C.I. Pigment Blue 15:6 and C.I. Pigment Violet 23 (weight ratio=90/10) as the colorant (A), 50 parts by weight of a copolymer of methacrylic acid/styrene/benzyl methacrylate/glycerol monomethacrylate/N-phenylmaleimide (weight ratio of 15/15/35/10/25, Mw=20,000, Mn=10,000) as the alkali-soluble resin (B), 50 parts by weight of dipentaerythritol hexaacrylate as the polyfunctional monomer (C), 5 parts by weight of 2,2'-bis(2,4-dichlorophenyl)-4,4',5,5'-tetraphenyl-1,2'-biimidazole, 5 parts by weight of 4,4'-bis(diethylamino) benzophenone and 50 parts by weight of 2-benzyl-2-dimethylamino-1-(4-morpholinophenyl)butan-1-one as the photopolymerization initiator (D), 5 parts by weight of 5-amino-1-pentanol as the organic amino compound (E) and 1,000 parts by weight of a mixture of ethyl 3-ethoxypropionic acid and cyclohexanone (weight ratio= 90/10) as a solvent.

Thereafter, a blue-striped color filter was formed on a substrate in the same manner as in Example 1 except that the liquid composition (B2) was used in place of the liquid composition (G1).

When the obtained color filter was observed using a projector, no stains were seen on the substrate of unexposed portions. In addition, adhesion between the obtained pixels and the substrate was excellent.

The radiation sensitive composition of the present invention shows excellent developability even when it contains a pigment in a high concentration, does not produce scum and stains on the substrate and the light screening layer of unexposed portions at the time of development and can provide pixels having excellent adhesion to the substrate and the light screening layer.

Therefore, the radiation sensitive composition of the present invention can be extremely advantageously used for the production of various types of color filters including a color filter for color liquid crystal display devices in the field of the electronic industry.

What is claimed is:

1. A radiation sensitive composition comprising (A) a colorant, (B) an alkali-soluble resin, (C) a polyfunctional monomer and (D) a photopolymerization initiator, wherein the alkali-soluble resin (B) is a copolymer of:
   (1) a monomer represented by the following formula (1):

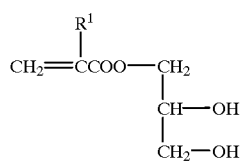

wherein $R^1$ is a hydrogen atom or a methyl group, and
   (2) an ethylenically unsaturated monomer having at least one carboxyl group in the molecule, and optionally
   (3) a copolymerizable ethylenically unsaturated monomer other than the above monomers (1) and (2).

2. The radiation sensitive composition of claim 1, wherein the colorant (A) is an organic pigment and/or carbon black.

3. The radiation sensitive composition of claim 1, wherein the monomer represented by the above formula (1) is at least one compound selected from the group consisting of glycerol monomethacrylate and glycerol monoacrylate.

4. The radiation sensitive composition of claim 1, wherein the ethylenically unsaturated monomer (2) having at least one carboxyl group in the molecule is at least one compound selected from the group consisting of acrylic acid, methacrylic acid, crotonic acid, α-chloroacrylic acid, ethacrylic acid, cinnamic acid, ω-carboxy-polycaprolactone monoacrylate, ω-carboxy-polycaprolactone monomethacrylate, mono(2-acryloyloxyethyl) succinate, mono(2-methacryloyloxyethyl) succinate, maleic acid, fumaric acid, itaconic acid and citraconic acid.

5. The radiation sensitive composition of claim 4, wherein the ethylenically unsaturated monomer (2) having at least one carboxyl group in the molecule is copolymerized in an amount of 5 to 50 wt % based on the copolymer.

6. The radiation sensitive composition of claim 1, wherein the alkali-soluble resin (B) is at least one member selected from the group consisting of a copolymer of methacrylic acid/glycerol monomethacrylate/benzyl methacrylate, a copolymer of methacrylic acid/glycerol monomethacrylate/styrene/N-phenylmaleimide, a copolymer of methacrylic acid/glycerol monomethacrylette/2-hydroxyethyl methacrylate/benzyl methacryleLte, a copolymer of methacrylic acid/mono(2-acrylcyloxyethyl) succinate/glycerol monomethacrylate/benzyl methacrylate, a copolymer of methacrylic acid/glycerol monomethacrylate/styrene/benzyl methacrylate/N-phenylmaleimide, a copolymer of methacrylic acid/mono(2-acryloyloxyethyl) succinate/glycerol monomethacrylate/styrene/N-phenylmaleimide, and a copolymer of methacrylic acid/mono(2-acryloyloxyethyl) succinate/glycerol monomethacrylate/2-hydroxyethyl methacrylate/benzyl methacrylate.

7. The radiation sensitive composition of claim 1, wherein the alkali-soluble resin (B) has a weight average molecular weight in terms of polystyrene of 3,000 to 300,000 and a number average molecular weight in terms of polystyrene of 3,000 to 60,000.

8. The radiation sensitive composition of claim 1, which contains the alkali-soluble resin (B) in an amount of 10 to 1,000 parts by weight based on 100 parts by weight of the colorant (A).

9. The radiation sensitive composition of claim 1, wherein the polyfunctional monomer (C) is a compound having at least two acrylate or methacrylate groups in the molecule.

10. The radiation sensitive composition of claim 1, which contains the polyfunctional monomer (C) in an amount of 5 to 500 parts by weight based on 100 parts by weight of the alkali-soluble resin (B).

11. The radiation sensitive composition of claim 1, wherein the polyfunctional monomer (C) is at least one member selected from the group consisting of trimethylolpropane triacrylate, pentaerythritol triacrylate, pentaerythritol tetraacrylate, dipentaerythritol pentaacrylate and dipentaerythritol hexaacrylate.

12. The radiation sensitive composition of claim 1, wherein the photopolymerization initiator (D) is at least one compound selected from the group consisting of imidazole compounds, benzoin compounds, acetophenone compounds, benzophenone compounds, α-diketone compounds, polynuclear quinone compounds, xanthone compounds, diazo compounds and triazine compounds.

13. The radiation sensitive composition of claim 1, which contains the photopolymerization initiator (D) in an amount of 0.01 to 200 parts by weight based on 100 parts by weight of the polyfunctional monomer (C).

* * * * *